United States Patent
Park

(10) Patent No.: US 9,536,299 B2
(45) Date of Patent: Jan. 3, 2017

(54) PATTERN FAILURE DISCOVERY BY LEVERAGING NOMINAL CHARACTERISTICS OF ALTERNATING FAILURE MODES

(71) Applicant: KLA-Tencor Corporation, Milpitas, CA (US)

(72) Inventor: Allen Park, San Jose, CA (US)

(73) Assignee: KLA-Tencor Corp., Milpitas, CA (US)

( * ) Notice: Subject to any disclaimer, the term of this patent is extended or adjusted under 35 U.S.C. 154(b) by 140 days.

(21) Appl. No.: 14/542,430

(22) Filed: Nov. 14, 2014

(65) Prior Publication Data
US 2015/0199803 A1    Jul. 16, 2015

Related U.S. Application Data

(60) Provisional application No. 61/928,259, filed on Jan. 16, 2014.

(51) Int. Cl.
    G06T 7/00    (2006.01)
    H01L 21/67   (2006.01)

(52) U.S. Cl.
    CPC ..... G06T 7/001 (2013.01); G06T 2207/30148 (2013.01); H01L 21/67288 (2013.01)

(58) Field of Classification Search
    None
    See application file for complete search history.

(56) References Cited

U.S. PATENT DOCUMENTS

| 6,902,855 | B2 | 6/2005 | Peterson et al. |
| 7,093,207 | B1 * | 8/2006 | Liao .............. G06Q 10/06 700/121 |
| 7,418,124 | B2 | 8/2008 | Peterson et al. |
| 7,570,796 | B2 | 8/2009 | Zafar et al. |
| 7,769,225 | B2 | 8/2010 | Kekare et al. |
| 8,041,106 | B2 * | 10/2011 | Tung-Sing Pak .... G01N 21/956 356/237.2 |
| 8,126,255 | B2 | 2/2012 | Bhaskar et al. |
| 8,213,704 | B2 | 7/2012 | Peterson et al. |

(Continued)

FOREIGN PATENT DOCUMENTS

JP    2013-053986    3/2013

OTHER PUBLICATIONS

International Search Report for PCT/US2015/011655 mailed Apr. 30, 2015.

*Primary Examiner* — Siamak Harandi
*Assistant Examiner* — Mai Tran
(74) *Attorney, Agent, or Firm* — Ann Marie Mewherter

(57) ABSTRACT

Methods and systems for detecting defects on a wafer are provided. One method includes acquiring output for a wafer generated by an inspection system. Different dies are printed on the wafer with different process conditions. The different process conditions correspond to different failure modes for the wafer. The method also includes comparing the output generated for a first of the different dies printed with the different process conditions corresponding to a first of the different failure modes with the output generated for a second of the different dies printed with the different process conditions corresponding to a second of the different failure modes opposite to the first of the different failure modes. In addition, the method includes detecting defects on the wafer based on results of the comparing step.

33 Claims, 6 Drawing Sheets

(56) References Cited

U.S. PATENT DOCUMENTS

| | | | |
|---|---|---|---|
| 2006/0133660 A1* | 6/2006 | Ogi | G06T 7/001 |
| | | | 382/149 |
| 2006/0161452 A1* | 7/2006 | Hess | G03F 1/144 |
| | | | 716/55 |
| 2006/0245636 A1* | 11/2006 | Kitamura | G06K 9/00 |
| | | | 382/149 |
| 2007/0052963 A1* | 3/2007 | Orbon | G03F 7/7065 |
| | | | 356/430 |
| 2007/0276634 A1 | 11/2007 | Smith et al. | |
| 2008/0072207 A1 | 3/2008 | Verma et al. | |
| 2009/0016595 A1* | 1/2009 | Peterson | G03F 1/84 |
| | | | 382/144 |
| 2011/0276935 A1* | 11/2011 | Fouquet | G06T 7/0006 |
| | | | 716/112 |
| 2012/0069330 A1 | 3/2012 | Lee et al. | |

* cited by examiner

PATTERN FAILURE DISCOVERY BY LEVERAGING NOMINAL CHARACTERISTICS OF ALTERNATING FAILURE MODES

BACKGROUND OF THE INVENTION

1. Field of the Invention

This invention generally relates to methods and systems for pattern failure discovery using comparisons of dies printed on a wafer with alternating failure modes for the wafer.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

In general, semiconductor fabrication processes involve printing multiple dies on a wafer at the same process conditions across the entire wafer. For example, an entire wafer is typically processed with the best known process conditions such that the same devices can be formed across the entire wafer with the greatest probability that the devices will be formed with the desired characteristics. However, in some instances, multiple dies may be printed on a single wafer with different process conditions. Such printing of a wafer may be performed such that dies printed at different process conditions can be used to determine more information about a design for the wafer or the process performed on the wafer.

In one such instance, a wafer may be printed with different focus and exposure values across the wafer. Modulated dies (i.e., the dies printed at values of the focus and exposure other than nominal) may be compared to a nominal die (i.e., a die printed at nominal values for the focus and exposure) using what is commonly referred to as a process window qualification (PWQ) wafer layout. Alternatively, a modulated die may be compared to an adjacent, less or more, modulated die using a focus exposure matrix (FEM) wafer layout. In a FEM wafer layout, the dies across a row on the wafer may be varied in exposure, and the dies across a column on the wafer may be varied in focus. In this manner, different dies can be printed on the same wafer with different combinations of focus and exposure dose. PWQ is intended to increase the detection sensitivity by comparing modulated dies to a nominal die. In contrast, FEM is often used to define a process window by comparing adjacent modulated dies to each other.

The methods described above that use modulated dies have several challenges. For example, too many defects can be detected in the methods described above, which impairs the ability to effectively sample defects. In particular, when comparing highly modulated dies to a nominal die, detection is easier but at modulations near normal, the noise level can increase. This results in a substantially high defect count and often makes it difficult to sample real defects. If a defect is sampled from a lower modulation, the amount of pattern deformation may be so small as to be non-existent and therefore may be ignored as nuisance. Often, defect review time is wasted, and a defect review tool user may experience fatigue in looking at so many non-relevant patterns. In other words, much effort can be wasted in inspecting and/or reviewing at irrelevant lithography conditions. In addition, even with exhaustive efforts in defect review, key weak points still may be missed due to lack of ability to verify the defects using scanning electron microscope (SEM) images.

The currently used wafer layouts for the methods described above are not efficient for delivering data with relatively high signal for the purposes of the experiments. For example, the shot locations of the wafer area used for nominal die (at least two columns) are wasted since they are not being used to print potential systematic defects. In turn, users often find that there is an insufficient number of modulations across a wafer. On the other hand, printing one die per modulation reduces the chance of finding systematic defects due to variation across the wafer. In addition, if the modulated die happens to be at a "quieter" area of the wafer, pattern failure due to cross-wafer variation may be captured as well.

Accordingly, it would be advantageous to develop systems and/or methods that do not have one or more of the disadvantages described above.

SUMMARY OF THE INVENTION

The following description of various embodiments is not to be construed in any way as limiting the subject matter of the appended claims.

One embodiment relates to a computer-implemented method for detecting defects on a wafer. The method includes acquiring output for a wafer generated by an inspection system. Different dies are printed on the wafer with different process conditions. The different process conditions correspond to different failure modes for the wafer. The method also includes comparing the output generated for a first of the different dies printed with the different process conditions corresponding to a first of the different failure modes with the output generated for a second of the different dies printed with the different process conditions corresponding to a second of the different failure modes opposite to the first of the different failure modes. In addition, the method includes detecting defects on the wafer based on results of the comparing step. The acquiring, comparing, and detecting steps are performed by a computer system.

The method described above may be performed as described further herein. In addition, the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for detecting defects on a wafer. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

An additional embodiment relates to a system configured to detect defects on a wafer. The system includes an inspection subsystem configured to generate output for a wafer. Different dies are printed on the wafer with different process conditions. The different process conditions correspond to different failure modes for the wafer. The system also includes a computer subsystem configured for performing the comparing and detecting steps of the method described above. The system may be further configured as described herein.

BRIEF DESCRIPTION OF THE DRAWINGS

Other objects and advantages of the invention will become apparent upon reading the following detailed description and upon reference to the accompanying drawings in which.

Figure 1:
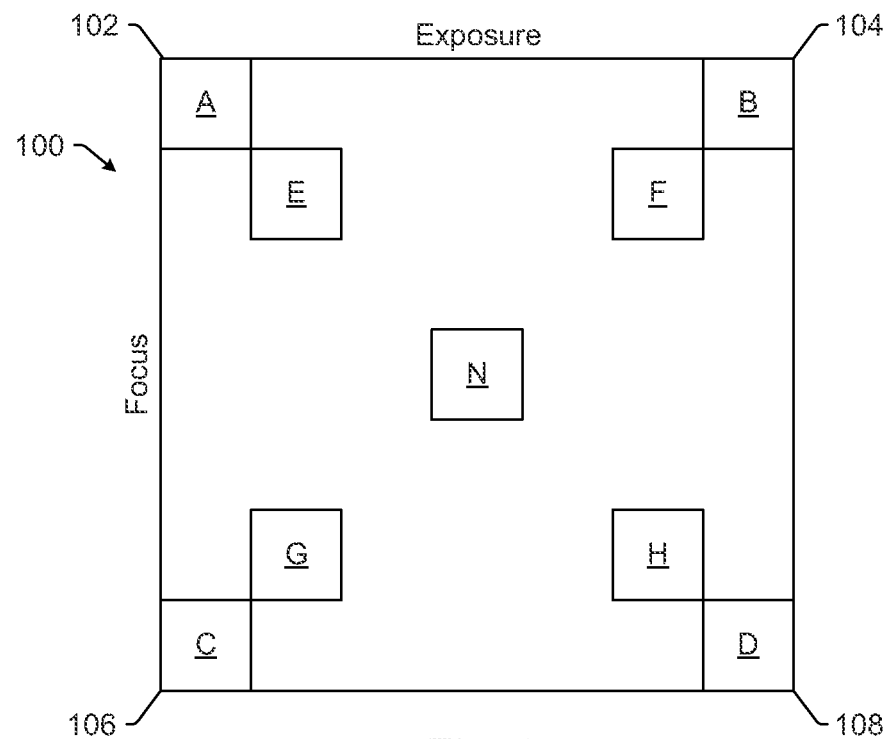
FIG. 1 is a schematic diagram illustrating one embodiment of a process window for a wafer and different process conditions at different corners of the process window.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a computer-implemented method for detecting defects on a wafer. The embodiments described herein provide methods and systems for identifying systematic pattern failures in effective ways using a modulated wafer layout. New wafer layouts are introduced here to decrease noise in data, increase the probability of detecting real defects, and enhance the ability to identify real systematic defects once they are reviewed on a defect review tool such as a scanning electron microscope (SEM). In addition, a new recipe generation (simpler) method is described further herein.

The method includes acquiring output for a wafer generated by an inspection system. The inspection system may be a light-based inspection system. In this manner, the inspection tool may be an optical inspection tool. However, the inspection system may be an electron beam-based inspection system. The inspection system may include any suitable commercially available light- or electron beam-based inspection system known in the art. In addition, the light-based inspection system may be a bright field (BF) and/or dark field (DF) inspection system. In this manner, the inspection system used in the embodiments described herein is not limited to BF, DF, and/or electron beam inspection. In other words, the embodiments described herein are independent of the inspection system platform.

Acquiring the output may include scanning light over the wafer and generating output (e.g., images or image data) responsive to light from the wafer detected by the inspection system during the scanning. In this manner, acquiring the output may include scanning the wafer. However, acquiring the output does not necessarily include scanning the wafer. For example, acquiring the output may include acquiring the output from a storage medium in which the output has been stored (e.g., by the inspection system). Acquiring the output from the storage medium may be performed in any suitable manner, and the storage medium from which the output is acquired may include any of the storage media described herein.

Different dies are printed on the wafer with different process conditions, and the different process conditions correspond to different failure modes for the wafer. The different process conditions may include any suitable process conditions of any suitable wafer fabrication process such as focus and exposure of a lithography process performed on a wafer. Such different process conditions may be used to print any of the new wafer layouts described herein. In addition, even though some wafer layouts are described herein with respect to focus and exposure, it is to be understood that any of the wafer layouts described herein can be used with any other different process conditions. Each of the different dies is printed with the same design for the wafer. In this manner, different dies include the same pattern features printed at different process conditions.

In one embodiment, the different process conditions corresponding to the different failure modes include process conditions at corners of a process window for the wafer. As used herein, the term "process conditions at corners of a process window" generally refers to process conditions having values exactly at the corners of the process window. However, the "process conditions at corners of a process window" may also include process conditions having values substantially near the corners of the process window. For example, the "process conditions at corners of a process window" may include process conditions that are only one increment away from the exact values at the corners and therefore may be slightly inside or slightly outside of the process window limits.

FIG. 1 illustrates one embodiment of a process window for a wafer and different process conditions at different corners of the process window. For example, as shown in FIG. 1, process window 100 may be defined for a process such as lithography. Such a process window may be defined as a function of exposure (shown on the x axis in FIG. 1) and focus (as shown on the y axis in FIG. 1). In this manner, the process window may be defined by a range of values for exposure and a range of values for focus.

In most instances, the nominal conditions for the process window will be at a center of the process window. For example, as shown in FIG. 1, nominal conditions for this process window are illustrated by process conditions N shown in FIG. 1.

The extreme values of the process window conditions define corners 102, 104, 106, and 108. In this manner, process window conditions A, B, C, and D may be at corners 102, 104, 106, and 108, respectively. In embodiments of the wafer layouts described herein and shown in the figures, the reference letters shown in FIG. 1 are used to refer to dies printed at these process window conditions. In other words, A dies are printed at process window conditions A shown in FIG. 1, B dies are printed at process window conditions B shown in FIG. 1, etc.

In another embodiment, two or more of the different dies are printed on the wafer with the different process conditions that are the same. For example, as will be described further herein, the wafer layouts of the embodiments may include more than one A die, more than B die, etc. printed at various locations on the wafer.

In some embodiments the first and the second of the different dies are printed adjacent to each other on the wafer in a row of dies extending across substantially an entire dimension of the wafer, and the row of dies includes dies printed with the different process conditions corresponding to the first of the different failure modes alternating with dies printed with the different process conditions corresponding to the second of the different failure modes. In this manner, the modulations can be repeated across the die to increase the chance of printing systematic defects across wafer level process variations due to conditions of fabrication processes (e.g., lithography, chemical-mechanical polishing (CMP), etch, and chemical vapor deposition (CVD)) performed on the wafer. As such, the embodiments described herein can use a repeating modulated die layout to capture wafer level failure signatures thereby increasing the chance of detection. In this manner, only corner rows may be inspected or reviewed for applications such as pattern failure discovery and validating the process specification limits described further herein.

Figure 2:
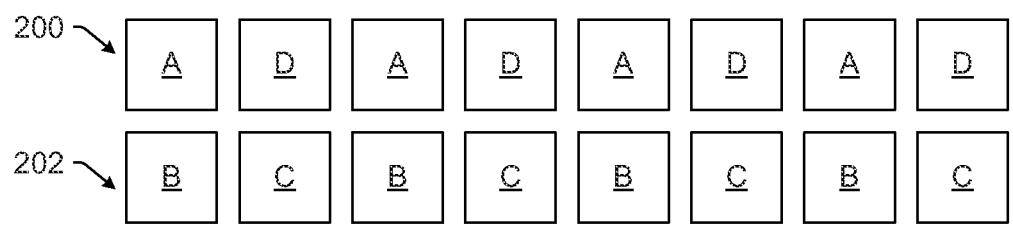
FIGS. 2-5 are schematic diagrams illustrating various embodiments of how different dies can be printed on a wafer with the different process conditions of FIG. 1.

FIG. 2 illustrates one such arrangement of dies on a portion of a wafer. In particular, as shown in FIG. 2, row 200 on a portion of a wafer (not shown in FIG. 2) includes A dies alternating with D dies. In addition, row 202 on a portion of the wafer includes B dies alternating with C dies. These rows of dies may extend across substantially an entire dimension of the wafer as described further herein. In addition, "substantially an entire dimension of the wafer" as used herein generally refers to an entire dimension of a wafer across which complete dies can be printed. For example, in any column or row of dies on a wafer, some portion of the wafer at the periphery of the wafer is generally not used for printing dies since only a portion of a die can be printed there. In addition, there is generally some non-printed space allowed between each die on a wafer such that there is no overlap between dies. As such, "substantially an entire dimension" generally refers to an entire dimension of a column or row on a wafer that excludes only non-usable portions of the wafer and the space between dies.

In the embodiment shown in FIG. 2, therefore, the dies that are compared to each other as described further herein can be printed in an alternating fashion across a row on the wafer. As such, as the row is scanned on the wafer by an inspection system, such as that described herein, the output of the inspection system generated for one die in a row can be compared to the output of the inspection system generated for the preceding die in the row on the specimen. Such printing of the dies, therefore, facilitates comparison between adjacent dies on the wafer, especially for comparisons that are performed as the scanning is being performed.

Figure 3:
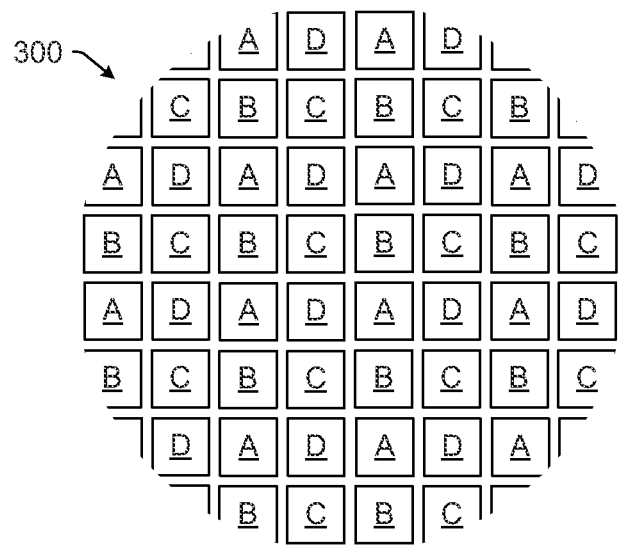

In one embodiment, all dies on the wafer are printed with the process conditions corresponding to one of the different failure modes. For example, dies may be printed on a wafer at only extreme corners within a process window. In one such example, as shown in FIG. 3, wafer 300 may be printed with only A dies, B dies, C dies, and D dies (i.e., dies printed at the corners of the process window as shown in FIG. 1). In this manner, an entire wafer may include only dies printed at the corner conditions A, B, C, and D shown in FIG. 1. Such a wafer may, therefore, be referred to as a "corner wafer." In this manner, the wafer may be printed only with extreme corner conditions of the process specifications. Printing shots with only corner conditions may be performed to generate a wafer layout with the largest possible pattern variation. In addition, using the entire wafer area for corner shots will help cover wafer level variation.

Figure 4:
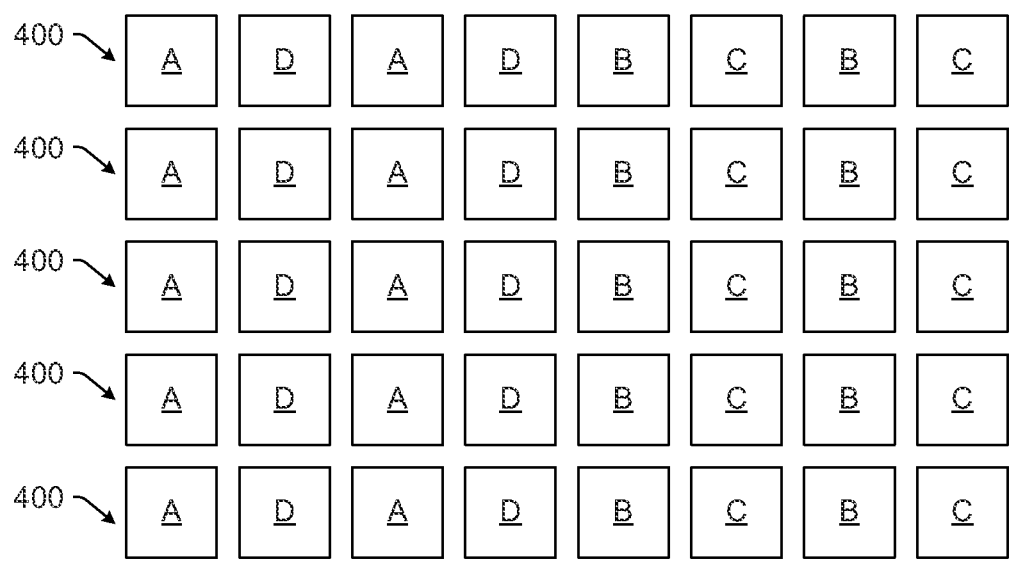

While the modulation sequences shown in FIGS. 2 and 3 may be particularly advantageous for some types of inspection system configurations and comparisons performed during inspection, it is to be understood that the dies described herein may be printed on the wafer in any other suitable arrangement. For example, as shown in FIG. 4, another modulation sequence may include a number of rows 400 printed on a wafer (not shown in FIG. 4). One half of each of the rows includes A dies alternating with D dies, and the other half of each of the rows includes B dies alternating with C dies. The number of dies included in each of the rows may be any suitable number up to the maximum that can be printed in the available space on the wafer. In addition, the number of rows printed on the wafer may be as many as the maximum allowable due to the available wafer space. In this manner, the modulation sequence shown in FIG. 4 may be used to print an entire wafer with dies printed at the corners of the process window.

In an additional embodiment, no dies on the wafer are printed with nominal process conditions for a process window for the different process conditions. For example, as shown in FIG. 3, an entire wafer may be printed with only dies at modulated process conditions. In addition, as described further herein, the comparisons used for defect detection may not involve any dies printed at nominal process conditions. Therefore, unlike previously used wafer layouts in which different dies are printed at different process conditions, the embodiments described herein may not include printing any dies at nominal process conditions or using any dies printed at nominal process conditions for comparisons. As such, the wafer layouts described herein may use all of the available space on the wafer for printing modulated dies.

In a further embodiment, no more than one of all dies on the wafer is printed with nominal process conditions for a process window for the different process conditions. For example, although it may be advantageous to not include any dies printed at nominal conditions in the wafer layouts described herein, the wafer layouts may include one or more nominal dies located in any position on the wafer. Whether or not one or more dies are printed on the wafer at nominal process conditions may be determined based on the types of defects that are to be detected on the wafer and therefore the types of comparisons that will be performed.

The method also includes comparing the output generated for a first of the different dies printed with the different process conditions corresponding to a first of the different failure modes with the output generated for a second of the different dies printed with the different process conditions corresponding to a second of the different failure modes opposite to the first of the different failure modes. For example, in one embodiment, the different process conditions corresponding to the different failure modes include process conditions at corners of a process window for the wafer, the different process conditions corresponding to the first of the different failure modes are at a first of the corners of the process window, and the different process conditions corresponding to a second of the different failure modes are at a second of the corners of the process window opposite to the first of the corners. In this manner, a die comparison to identify systematic defects is performed by comparing one extreme modulated die to the other extreme modulated die opposite to it. This way, every die has the potential to enable detection of real defects (e.g., open or short depending on the direction of modulation). In addition, since opposite modulations will exhibit different pattern failures, the nominal nature of each modulation can be leveraged to find faults in other modulations and therefore creates efficiency in the use of wafer real estate. For example, one modulated shot described herein can be leveraged as a "nominal" condition for another modulated shot by using different failure modes. In other words, one pattern type failure at one modulation condition produces a nominal condition at another site. In this manner, the comparing step generates a "pseudo nominal" die by comparing die from different failure modes. As such, the shots printed on the wafer may be limited to include only relevant lithography conditions closer to the limits or corners of the process specification for effective use of wafer area. In the context of the process conditions shown in FIG. 1, therefore, the comparing step described above may include comparing output for an A die with output for a D die or comparing output for a B die with output for a C die.

In one embodiment, the comparing step includes comparing the output generated for a third of the different dies printed with the different process conditions corresponding to a third of the different failure modes with the output generated for a fourth of the different dies printed with the different process conditions corresponding to a fourth of the different failure modes opposite to the third of the different failure modes. For example, the comparing step may include two comparisons, one for each set of opposite corners. In one such example in the context of the process conditions shown in FIG. 1, therefore, the comparing step may include comparing output for an A die with output for a D die and comparing output for a B die with output for a C die.

In another embodiment, the method does not include comparing the output generated for any of the different dies with output for a die printed with nominal process conditions for a process window for the different process conditions. For example, the embodiments described herein may involve comparing the extreme modulations without the use of nominal die. Therefore, the embodiments described herein may use a modulated wafer without nominal conditions.

The method further includes detecting defects on the wafer based on results of the comparing step. For example, the comparing step will include comparing output generated for different dies at the same within die locations. In this manner, the comparing step will compare the output for the same pattern types printed at different modulated process conditions. The comparing step may, therefore, generate a difference image, which includes the differences between two dies as a function of position within the die. Those differences can then be examined further to determine if they correspond to a potential defect. For example, detecting the defects may include comparing the difference images generated for the different dies to a threshold. Portions of the difference images above the threshold may be identified as potential defects while portions of the difference images below the threshold may not be identified as potential defects. Any suitable method or algorithm may be used to perform the comparing step. In addition, any suitable defect detection method or algorithm may be applied to the results of the comparing step to detect defects on the wafer. In other words, any defect detection method or algorithm can be used with the comparison step results described herein. In this manner, the embodiments described herein are not defect detection method or algorithm specific as long as the defect detection method or algorithm can be modified to use the comparison step results described herein as input. However, a new inspection recipe can also or alternatively be generated to optimize sensitivity for comparing the modulated die.

The defects that are detected include systematic defects. Systematic defects can be detected much easier in the embodiments described herein than in other methods and systems that are currently used since the embodiments described herein use comparisons of dies printed at or near the process window limits to detect defects on the wafer. For example, identifying systematic defects at lower modulations is substantially difficult. In particular, lower modulations may exhibit substantially small or no pattern deformation. If such a defect is sampled in defect review, it may be classified as a nuisance. In addition, when the modulation of the dies being compared is relatively low (e.g., comparing a die printed at process conditions relatively close to nominal with a die printed at the nominal process conditions), the increased noise in the defect detection results can make it more difficult to see real failures on the wafer. Therefore, using modulation levels at or near the process condition limits increases the chances of detecting defects that are real defects. In other words, more systematic defects can be detected as the process conditions become more modulated. Furthermore, the probability of detecting real systematic defects increases exponentially as the modulation increases. As such, the embodiments described herein have a much better chance of detecting real systematic defects than methods and systems that are performed with dies printed at lower modulations.

At least some locations of the defects that are detected include previously undetected pattern failures in a design for the wafer. For example, defect discovery can include detecting pattern systematic defects (weak patterns), process-induced systematic defects, and yield relevant particles. "Pattern failures" can be generally defined as weak points in a design that may fail within process specification limits. The embodiments described herein can be used to discover all weak points in the design for the wafer that may fail within process specification limits. In particular, the corner shots described herein may be used to discover all weak patterns in the design. In this manner, the embodiments described herein can discover pattern failures by leveraging the nominal conditions of alternating failure modes. In other words, the pattern failures can be detected by comparing modulated dies with different failure mechanisms, where one failure mode behaves as a "nominal" condition to another failure mode by leveraging the low probability of failures within the process window conditions. In a typical defect comparison, bad is compared to good to find the bad. However, in this scenario, two potential bad conditions are used but bad points are identified by comparing to the good portion of the alternating bad conditions. In one such example, the comparing step described herein may include comparing a sine curve to a cosine curve to detect high and low points rather than comparing a sine curve to a flat line. Yield relevant particle detection may be performed by comparing nominal shots to identify random defects.

Pattern failure discovery can often be confused with process window definition. Unlike process window determination, however, the goal of pattern failure discovery is to discover all weak pattern types in a design and not to define operating ranges of focus and exposure. For example, in pattern failure discovery, the process specifications (e.g., focus/exposure specifications) may already be defined. To discover pattern failures effectively, it is best to reduce defects being generated from shots that are near nominal conditions. Therefore, inspection and review may be limited to only corners for discovery where it matters. In this manner, the defect count produced by inspection can be dramatically limited. In addition, care areas can be used to limit inspection and review to critical areas to further reduce the defect count. As such, the embodiments described herein improve the detection sensitivity for pattern failures by comparing dies (or shots) from extreme modulations to amplify the difference images. In addition, dies printed at the four corners of the process window may be used for pattern failure discovery, and the entire wafer may be printed with such dies to identify weak pattern types across the entire wafer.

In another embodiment, the corners of the process window are defined by maximum and minimum values for the different process conditions, the different process conditions include process conditions at inner corners of the process window, and the inner corners are adjacent to the corners and closer to nominal process conditions than the corners. In this manner, the wafer layout can be expanded to include some additional modulations on the wafer. The additional modulations may be printed at additional secondary corners within the process window.

In one example, as shown in FIG. 1, process conditions A, B, C, and D may be at the corners of the process window, which are defined by the maximum and minimum values for focus and dose. In some embodiments, it may be advantageous to use other process conditions such as process conditions E, F, G, and H, which are just inside the process conditions at the corners. In this manner, process conditions E, F, G, and H may be located at inner corners that are opposite to one another. For example, as shown in FIG. 1, process conditions E and H are located at opposite inner corners, and process conditions F and G are located at opposite inner corners. In addition, as shown in FIG. 1, process conditions E, F, G, and H are spaced from nominal process conditions N. Therefore, although process conditions E, F, G, and H are closer to nominal than the process conditions at the corners, process conditions E, F, G, and H are still relatively highly modulated. For example, process conditions E, F, G, and H may be spaced from nominal as much as possible without overlapping with the process conditions at the corners. In this manner, A, B, C, and D shown in FIG. 1 represent shots at the extreme corners of the process window, and E, F, G, and H represent shots at secondary modulations closer to nominal. In embodiments of the wafer layouts described herein and shown in the figures, the reference letters shown in FIG. 1 are used to refer to dies printed at these process window conditions. In other words, E dies are printed at process window conditions E shown in FIG. 1, F dies are printed at process window conditions F shown in FIG. 1, etc.

Figure 5:
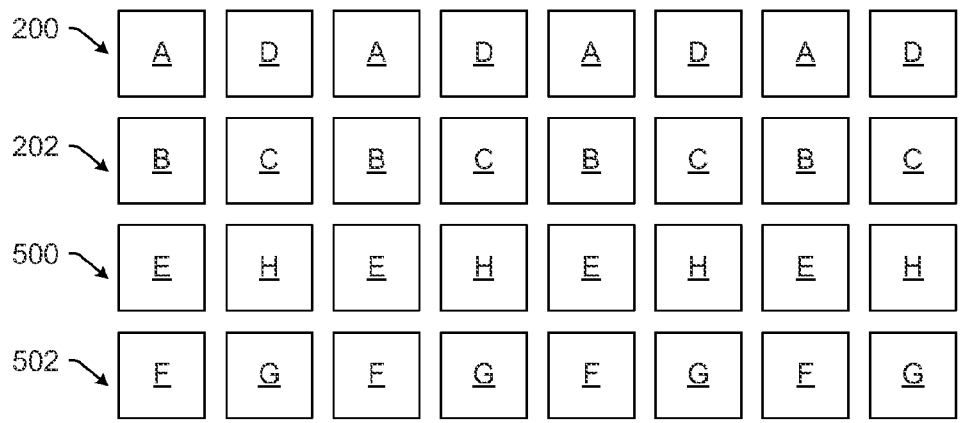

FIG. 5 illustrates one arrangement of such dies on a portion of a wafer. In particular, as shown in FIG. 5, row 200 on a portion of a wafer (not shown in FIG. 5) includes A dies alternating with D dies. In addition, row 202 on a portion of the wafer includes B dies alternating with C dies. These rows of dies may be configured as described further herein. Such an arrangement may also include row 500 on a portion of the wafer that includes E dies alternating with H dies and row 502 on a portion of the wafer that includes F dies alternating with G dies. These rows may be configured as described further herein. Therefore, any one wafer may include different rows of dies, and each row of dies may include only the dies that will be compared to each other. Furthermore, any wafer may include more than one of any of the rows shown in FIG. 5. For example, a wafer may include two of rows 200, two of rows 202, one of row 500, and one of row 502. In addition, any of the rows or sets of rows described herein may be repeated across the wafer as much as the spacing allows. In addition, while the modulation sequence shown in FIG. 5 may be particularly advantageous for some types of inspection system configurations and comparisons performed during inspection, it is to be understood that the dies described herein may be printed on the wafer in any other suitable arrangement.

If the wafer layout is expanded to include some additional modulations such as those described above, the comparing step should still include comparing die from opposite, extreme modulation conditions. However, such embodiments may also include other comparisons such as those described further herein. For example, in one such embodiment, the comparing step includes comparing the output generated for a third of the different dies printed with the different process conditions at a first of the inner corners of the process window with the output generated for a fourth of the different dies printed with the different process conditions at a second of the inner corners opposite to the first of the inner corners. In one such example based on the layout shown in FIG. 1, the comparing step may include comparing E dies with H dies and/or F dies with G dies.

Including comparisons of dies printed at modulations other than just those at the extreme corners may be advantageous in some situations. For example, the comparisons performed at the extreme (or primary) corners may be particularly useful for defect type discovery and process specification validation, which may be performed as described further herein. The comparisons performed at the secondary corners may be used for pattern reliability checks. For example, since not all sites will fail within the production specifications, difference images are expected to be probable systematic defects. However, if too may real systematic defects are detected at the extreme corners, the secondary corners described herein can be used to understand the extent of the problem with a narrower window within the process specification. Performing inspection using secondary modulations (at the inner corners described above) may further understanding of the patterning behavior within the specification limits.

In addition, although it may be particularly advantageous to not include dies printed at nominal or near nominal conditions in the wafer layouts described herein, the methods described herein may include comparing output generated by an inspection system for a die printed at nominal conditions with output generated by the inspection system for a die printed at near nominal conditions. Such comparisons may be used for determining pattern behavior at near nominal conditions. For any of the comparisons described herein performed with any of the modulations described herein, defects from each modulation can be evaluated separately through defect binning and/or classification as described further herein.

In some embodiments, the process window is determined by another method or system, and the method includes determining if the process window is correct based on the defects detected on the wafer. For example, the focus/exposure production specification may be defined prior to the methods described herein being performed. In this manner, the embodiments described herein can be used to validate a process window. In addition, the embodiments described herein can be used to validate a process window across die, reticle, and wafer level data with sufficient sampling.

Figure 6:
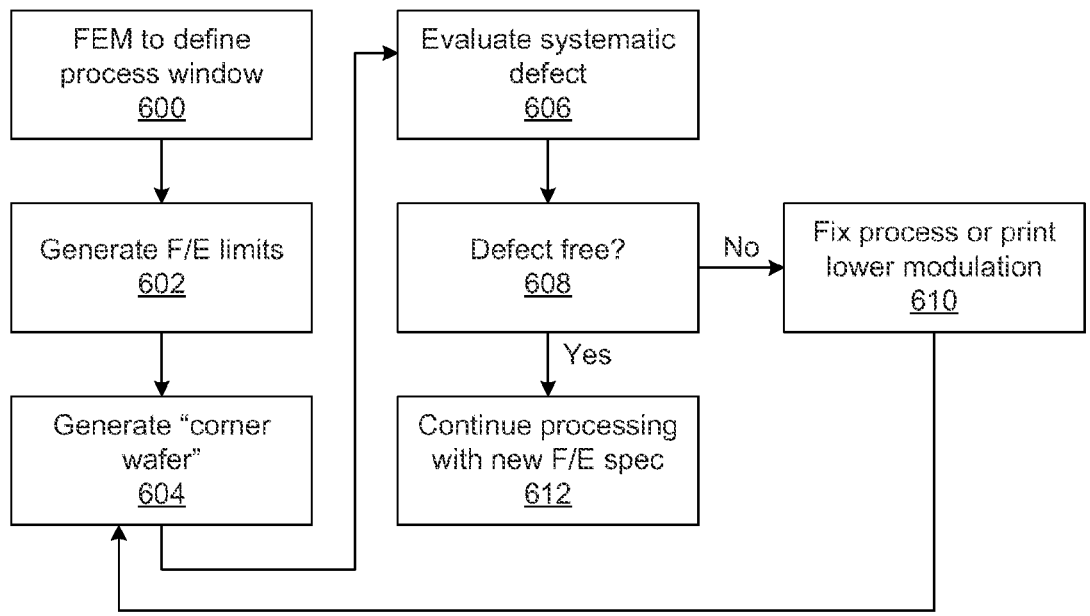
FIGS. 6-7 are flow charts illustrating various embodiments of validating and/or determining a process window and design weak points as defined by systematic defect for a wafer.

FIG. 6 illustrates one embodiment of a method for validating a process window for a lithography process using the wafer layouts described herein. Although the steps shown in FIG. 6 are described with respect to a lithography process, it is to be understood that the method may be performed for any wafer fabrication process. As shown in FIG. 6, the method may include FEM to define process window step 600. In this step, a focus/exposure matrix or FEM wafer may be printed using the lithography process and then inspected to detect defects that are printed at different focus and exposure conditions. The process window may then be determined based on the defects. For example, the process window may be determined to include only those focus and exposure conditions at which no or only acceptable defects are printed. The method also includes generate F/E limits step 602. In this step, the lower and upper limits for both focus and exposure may be determined based on the process window defined in step 600.

As further shown in FIG. 6, the method may include generate corner wafer step 604. The corner wafer may be generated as described herein. The method also includes evaluate systematic defect step 606. In this step, the comparing and detecting steps described herein may be performed for the corner wafer generated in step 604. The defects detected in this step may include mostly systematic defects, and the entire defect population detected for the corner wafer may be evaluated to determine which defects are systematic defects.

The method shown in FIG. 6 further includes determining if the corner wafer is defect free as shown in step 608, which may be performed based on any of the defect detection results generated for the corner wafer. If the wafer is determined to not be defect free, the method may include fixing the process or printing lower modulation step 610. For example, if the corner wafer is determined to not be defect free, then another wafer may be printed with the inner or secondary corner modulations described herein by performing step 604 again but with different modulations than the first time. This wafer may then be inspected as described herein, and the systematic defects detected on this wafer may be evaluated in step 606. Step 610 may also or alternatively include altering one or more conditions of the process based on the defects detected on the corner wafer to thereby fix the process. For example, step 610 may include determining which values of the one or more conditions at which no defects were detected and then altering the process window for the process to include only those values of the one or more conditions.

Steps 604, 606, 608, and 610 may be performed until a wafer is generated that is determined to be defect free. For example, as shown in FIG. 6, when a wafer is determined to be defect free in step 608, the method may include continue processing with new F/E specifications step 612. In this manner, the method shown in FIG. 6 may include determining a process window and then validating and possibly altering or modifying the process window (if necessary) using corner wafer results generated with one or more versions of the corner wafers described herein. The embodiment shown in FIG. 6 may include any other step(s) of any other method(s) described herein. In addition, in some instances described further herein in which a process window is defined by one method and then validated or altered using the corner wafer(s) described herein, steps 600 and 602 shown in FIG. 6 may be performed by one method or system, and steps 604, 606, 608, 610, and 612 may be performed by another method or system.

Figure 7:
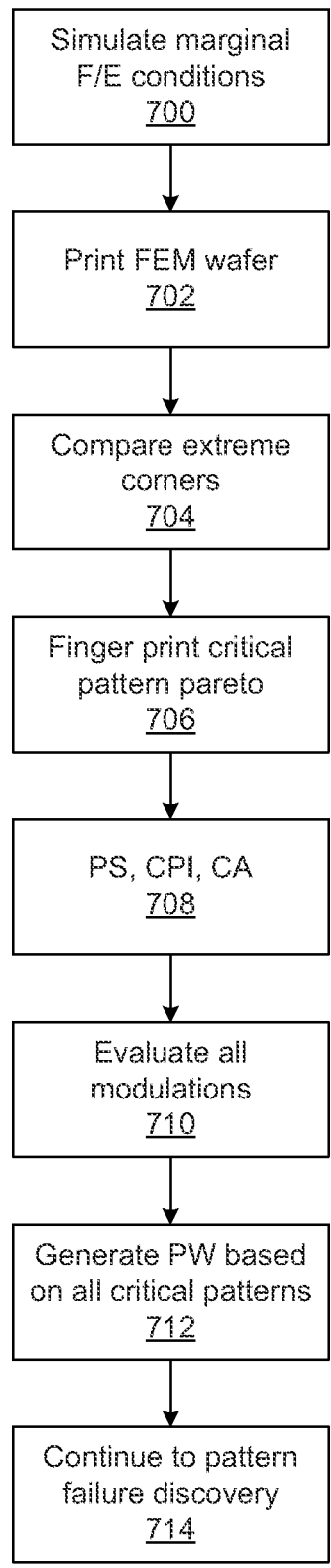
Figure 7:
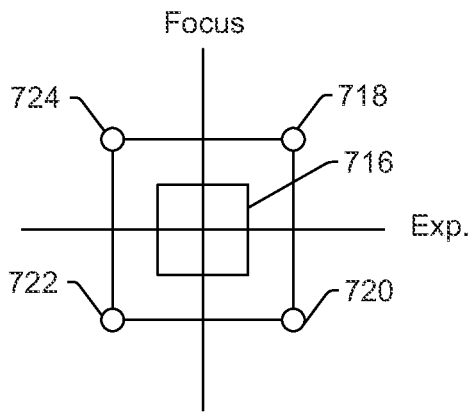

One embodiment of steps that may be performed to determine a process window is shown in FIG. 7. Although the steps shown in FIG. 7 are described with respect to a lithography process, it is to be understood that the method may be performed for any wafer fabrication process. The steps shown in FIG. 7 may be performed to determine a process window while reducing the data required to define a process window using a FEM wafer. In one embodiment, the method includes determining the process window by simulating printing of the wafer to determine an expected process window. For example, as shown in FIG. 7, the method may include simulate marginal F/E conditions step 700. Simulating the marginal focus and exposure conditions may be performed using any suitable commercially available method or system. As described further herein, the simulation may be used to identify a "rough window" such that conditions relative to the rough window can be used for defining the process specifications and process window.

Determining the process window also includes acquiring additional output for another wafer generated by the inspection system or another inspection system. Different dies are printed on the other wafer with additional process conditions, and the additional process conditions include process conditions adjacent to expected corners of the expected process window and farther from nominal process conditions than the expected corners. For example, as shown in FIG. 7, the method may include print FEM wafer step 702. The FEM wafer may be printed in any suitable manner including those described further herein. The FEM wafer may also be printed by leveraging the theoretical predictions determined in step 700 to define the target conditions. For example, as shown in FIG. 7, expected process window 716 may be determined based on the simulation results produced in step 700 and may be defined by different values for focus and exposure. Then, the target conditions for the FEM wafer may be determined based on the expected process window. For example, the target conditions may include additional process conditions 718, 720, 722, and 724. Each of these process conditions are adjacent to expected corners of the expected process window and farther from nominal process conditions (located at the center of expected process window 716) than the expected corners. Therefore, in these embodiments the FEM wafer may be printed with modulations slightly beyond the expected process window to discover pattern types that may be problematic for the process.

Determining the process window further includes comparing the additional output generated for a first of the different dies printed on the other wafer with the additional process conditions adjacent to a first of the expected corners with the additional output generated for a second of the different dies printed on the other wafer with the additional process conditions adjacent to a second of the expected corners opposite from the first of the expected corners. For example, as shown in FIG. 7, the method may include compare extreme corners step 704, which may be performed as described further herein. In particular, for the process conditions shown in FIG. 7, a die printed at process conditions 718 may be compared with a die printed at process conditions 722, and a die printed at process conditions 720 may be compared with a die printed at process conditions 724.

The dies printed at the corner conditions may be compared on the inspection system that generates the output for the dies. However, the output may be generated by an inspection system that has scanning and handling capabilities for physical wafers like those described herein and/or by a virtual inspection system or inspection system which can perform inspection-like functions using output generated by an actual inspection system and stored in the virtual inspection system or a storage medium accessible to the virtual inspection system. Examples of such virtual inspection systems or virtual inspectors (VI) are described in U.S. Pat. No. 8,126,255 issued on Feb. 28, 2012 to Bhaskar et al., which is incorporated by reference as if fully set forth herein. The embodiments described herein may be further configured as described in this patent.

Determining the process window also includes detecting defects on the other wafer based on results of comparing the additional output and determining the process window based on the defects detected on the other wafer. For example, as shown in FIG. 7, the method may include finger print critical pattern pareto step 706. In this step, binning of defects may be performed as described further herein such that defects that are located on or near the same patterns are binned into the same groups. Then, one or more paretos may be generated to illustrate the numbers of defects detected for each of the different patterns. In this manner, the paretos may provide a finger print of the critical patterns (i.e., the patterns that exhibit the most defects).

In some instances, the method may also include PS, CPI, and CA step 708. In this step, pattern search (PS), context point inspection (CPI), and care areas (CA) help focus inspection and review to relevant defects on a wafer and therefore may be used to detect critical patterns in the modulations closer to nominal. For example, PS, CPI, and CA can be used to limit inspection and review to only patterns known to be important, critical, problematic, etc. Therefore, for inspections that can generate a significant amount of noise or nuisance including those that are performed using comparisons of dies printed at near nominal conditions, limiting the inspection and review to only the patterns identified via PS, CPI, and/or CA can eliminate a substantial amount of defect information that is not of interest to the user. However, PS, CPI and/or CA can be used for inspection and review performed at any of the modulations described herein.

The embodiments may also include evaluate all modulations step 710, which may be performed as described further herein. In addition, the method may include generate process window (PW) based on all critical patterns step 712. In this step, the process window may be determined as described further herein based on only the critical patterns in the design printed on the wafer. The method also includes continue to pattern failure discovery step 714, which may also be performed according to any of the embodiments described herein.

In one embodiment, the method includes binning the defects detected on the wafer into different groups, and the binning is performed separately for the different dies that are printed with the different process conditions. For example, each die type (such as A, B, C, and D) described herein may exhibit different pattern failure types and the defect populations detected in each die type can be binned independently of each other die type to fully explore pattern types. In this manner, binning may be performed separately for each modulation level (or corner) to bin all critical pattern failures effectively. In addition, performing binning separately for each corner shot can ensure that systematic defects are sampled in the selecting step described further herein. New decision trees can be built to independently perform binning for each modulation type.

In one such embodiment, the different groups correspond to different patterns in a design for the wafer. For example, binning may be performed based on pattern type such that defects that are located on or near the same types of patterns are binned into the same group while defects that are located on or near other types of patterns are binned into other groups. Such binning may be commonly referred to as design based binning (DBB) or design based grouping (DBG), which may be performed as described in U.S. Pat. No. 7,570,796 issued on Aug. 4, 2009 to Zafar et al., which is incorporated by reference as if fully set forth herein. The pattern based binning performed in or by the embodiments described herein may include any other types of pattern based binning described in this patent such as design based classification (DBC). The embodiments described herein may be further configured as described in this patent. In addition, with any of the new wafer layouts described herein, any binning capability can be used (e.g., decision trees, DBB, etc.).

In another embodiment, the method includes selecting one or more of the defects detected on the wafer for defect review, and selecting the one or more defects is performed separately for the different dies that are printed at the different process conditions. The embodiments may include such independent sampling and prioritization by each modulation group to enhance the sampling probability. For example, defect binning results (e.g., DBG paretos) for each of the differently modulated dies are expected to be different and therefore it may be advantageous for sampling to be performed separately for each modulation type, possibly with different priorities for different modulations and/or different priorities for different defect types detected at any one modulation. Sampling performed separately for each modulation level (or corner) may effectively sample all critical pattern failures. In addition, using data from only the corner shots will help improve signal and reduce total defect count to help sampling requirements. In this manner, the embodiments described herein can decrease defect review sampling as much as possible while still sampling all critical defects. In addition, the embodiments described herein can improve defect sampling by fine tuning types of pattern failure and by using pattern based grouping such as DBB to reduce bin types.

Figure 8:
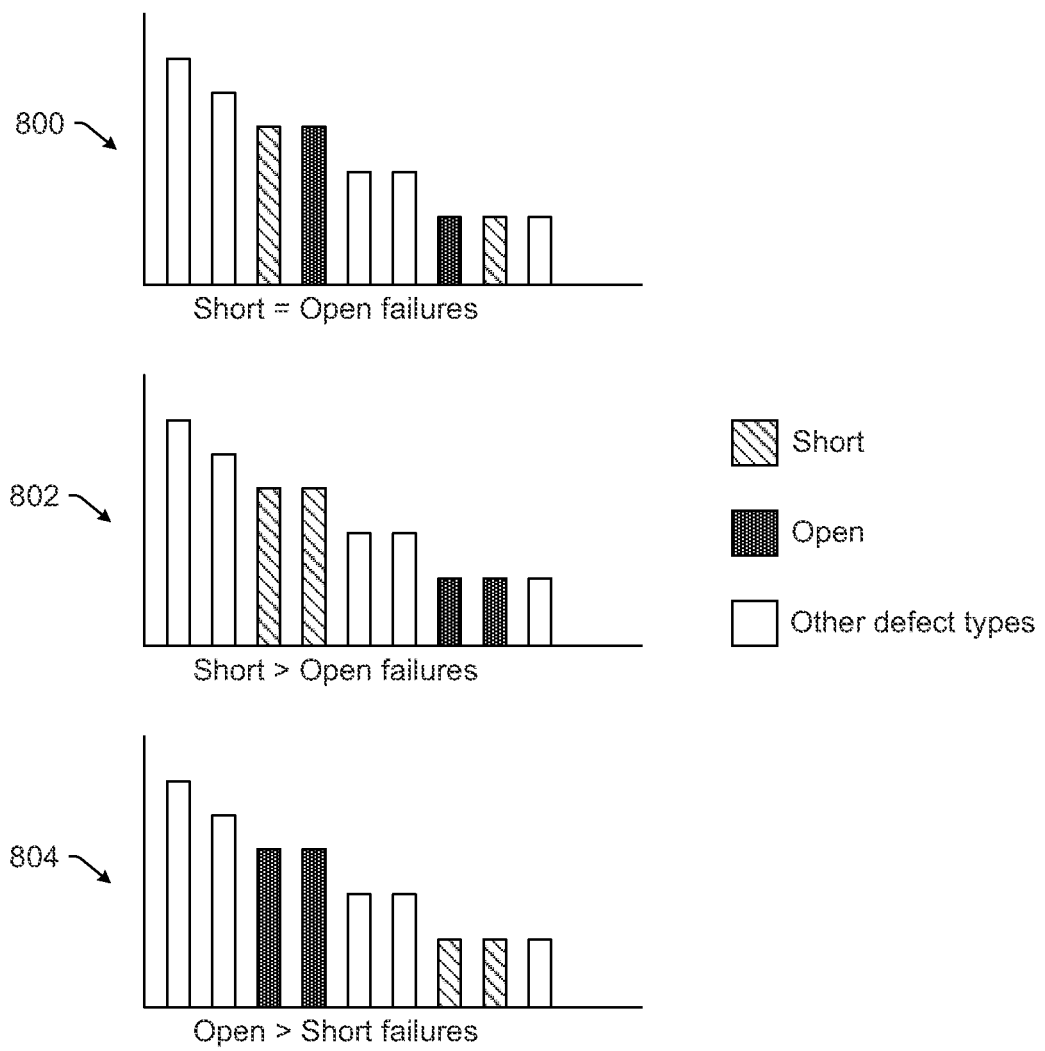
FIG. 8 is a schematic diagram illustrating examples of defect detection results that may be produced by the embodiments described herein.

The sampling performed in the embodiments described herein may therefore be biased sampling in that the sampling can be biased by the modulation of the dies, which can improve identification of particular defect types. In another example, critical pattern failures can be in the form of opens and shorts. Global sampling provides a fair chance of sampling for both opens and shorts only if the frequency of opens equals shorts. For example, in one case shown in pareto 800 of FIG. 8, the number of shorts equals the number of failures. However, in typical processes and designs, this case is not common. For example, in a different case shown in pareto 802 of FIG. 8, the number of shorts is greater than the number of opens while in another different case shown in pareto 804 of FIG. 8, the number of opens is greater than the number of shorts. Therefore, in most instances, separate processing of different modulation conditions is ideal for picking the right sampling. As such, for improved identification of each defect type, pattern based grouping (e.g., DBB) and sampling should be separated. In particular, grouping and sampling should be separated for A, B, C, and D corner dies.

The embodiments described herein have a number of advantages over currently used methods and systems. For example, modulated wafer layouts such as FEM and process window qualification (PWQ) are already widely adopted in the semiconductor industry. However, methods and systems that use such layouts suffer from substantially high levels of noise in the inspection results and the extended time required to analyze the data since typical defect data from such inspections is overwhelmed with substantially high defect counts. In contrast, the embodiments described herein reduce total defect count by eliminating highly defective die due to extreme modulations. In this manner, the embodiments described herein reduce overall defect count and increase the signal-to-defect by only inspecting relevant modulations. Therefore, the embodiments described herein can detect systematic defects with greater ease than other currently used systems and methods. In addition, the embodiments described herein are relatively simple to implement. Furthermore, since systematic defect discovery is substantially important to wafer inspection tool users, the embodiments described herein can increase adoption of current and future wafer inspection tools. In addition, the embodiments described herein improve the coverage of wafer level variations. With improved wafer coverage, the embodiments described herein also introduce advantages over SEM based solutions in delivering more comprehensive solutions across the wafer with better sampling. The embodiments described herein can also be used to improve defect sampling and to improve review capability of systematic defects by only reviewing systematic defects with high enough deformation. Furthermore, the improved sampling described herein may be used with other currently used wafer layouts but the relatively high level of noise due to those other wafer layouts cannot be mitigated.

The acquiring, comparing, and detecting steps described herein are performed by a computer system, which may be configured as described further herein.

Each of the embodiments of the method described above may include any other step(s) of any other method(s) described herein. Furthermore, each of the embodiments of the method described above may be performed by any of the systems described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 9:
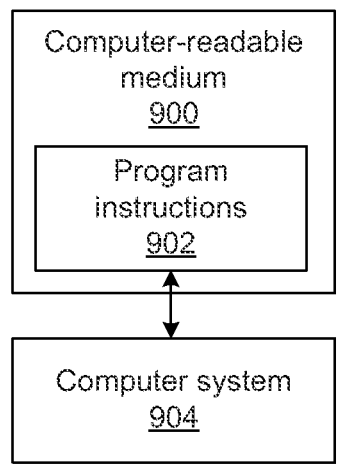
FIG. 9 is a block diagram illustrating one embodiment of a non-transitory computer-readable medium that includes program instructions executable on a computer system for performing one or more of the computer-implemented methods described herein.

An additional embodiment relates to a non-transitory computer-readable medium storing program instructions executable on a computer system for performing a computer-implemented method for detecting defects on a wafer. One such embodiment is shown in FIG. 9. In particular, as shown in FIG. 9, computer-readable medium 900 includes program instructions 902 executable on computer system 904. The computer-implemented method includes the steps of the method described above. The computer-implemented method for which the program instructions are executable may include any other step(s) described herein.

Program instructions 902 implementing methods such as those described herein may be stored on computer-readable medium 900. The computer-readable medium may be a storage medium such as a magnetic or optical disk, or a magnetic tape or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system may also include any suitable processor known in the art such as a parallel processor. In addition, the computer system may include a computer platform with high speed processing and software, either as a standalone or a networked tool.

Figure 10:
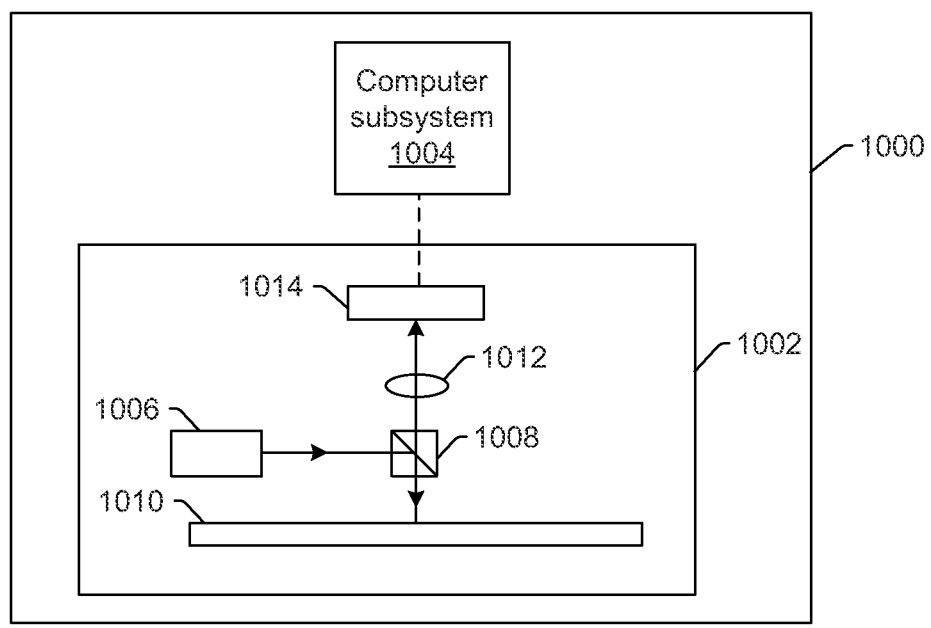
FIG. 10 is a schematic diagram illustrating a side view of one embodiment of a system configured to detect defects on a wafer.

An additional embodiment relates to a system configured to detect defects on a wafer. One embodiment of such a system is shown in FIG. 10. System 1000 includes inspection subsystem 1002 configured to generate output for a wafer, which is configured in this embodiment as described further herein. The system also includes computer subsystem 1004 configured for performing the comparing and detecting steps described herein. The computer subsystem may be configured to perform these steps according to any of the embodiments described herein. The computer subsystem and the system may be configured to perform any other step(s) described herein and may be further configured as described herein.

The inspection subsystem may be configured to generate the output for the wafer by scanning the wafer with light and detecting light from the wafer during the scanning. For example, as shown in FIG. 10, the inspection subsystem includes light source 1006, which may include any suitable light source known in the art. Light from the light source may be directed to beam splitter 1008, which may be configured to direct the light from the light source to wafer 1010. The light source may be coupled to any other suitable elements (not shown) such as one or more condensing lenses, collimating lenses, relay lenses, objective lenses, apertures, spectral filters, polarizing components and the like. As shown in FIG. 10, the light may be directed to the wafer at a normal angle of incidence. However, the light may be directed to the wafer at any suitable angle of incidence including near normal and oblique incidence. In addition, the light or multiple light beams may be directed to the wafer at more than one angle of incidence sequentially or simultaneously. The inspection subsystem may be configured to scan the light over the wafer in any suitable manner.

Light from wafer 1010 may be collected and detected by one or more channels of the inspection subsystem during scanning. For example, light reflected from wafer 1010 at angles relatively close to normal (i.e., specularly reflected light when the incidence is normal) may pass through beam splitter 1008 to lens 1012. Lens 1012 may include a refractive optical element as shown in FIG. 10. In addition, lens 1012 may include one or more refractive optical elements and/or one or more reflective optical elements. Light collected by lens 1012 may be focused to detector 1014. Detector 1014 may include any suitable detector known in the art such as a charge coupled device (CCD) or another type of imaging detector. Detector 1014 is configured to generate output that is responsive to the reflected light collected by lens 1012. Therefore, lens 1012 and detector 1014 form one channel of the inspection subsystem. This channel of the inspection subsystem may include any other suitable optical components (not shown) known in the art.

Since the inspection subsystem shown in FIG. 10 is configured to detect light specularly reflected from the wafer, the inspection subsystem is configured as a BF inspection subsystem. Such an inspection subsystem may, however, also be configured for other types of wafer inspection. For example, the inspection subsystem shown in FIG. 10 may also include one or more other channels (not shown). The other channel(s) may include any of the optical components described herein such as a lens and a detector, configured as a scattered light channel. The lens and the detector may be further configured as described herein. In this manner, the inspection subsystem may also be configured for DF inspection.

Computer subsystem 1004 is coupled to the inspection subsystem such that output generated by the detector(s) during scanning may be provided to computer subsystem 1004. For example, the computer subsystem may be coupled to detector 1014 (e.g., by one or more transmission media shown by the dashed line in FIG. 10, which may include any suitable transmission media known in the art) such that the computer subsystem may receive the output generated by the detector.

The computer subsystem may be configured to perform any step(s) described herein. For example, computer subsystem 1004 may be configured for performing the comparing and detecting steps as described herein. In addition, computer subsystem 1004 may be configured to perform any other steps described herein. The computer subsystem may also be configured as a virtual inspector such as that described in U.S. Pat. No. 8,126,255 issued on Feb. 28, 2012 to Bhaskar et al., which is incorporated by reference as if fully set forth herein.

It is noted that FIG. 10 is provided herein to generally illustrate a configuration of an inspection subsystem that may be included in the system embodiments described herein. Obviously, the inspection subsystem configuration described herein may be altered to optimize the performance of the inspection subsystem as is normally performed when designing a commercial inspection system. In addition, the systems described herein may be implemented using an existing inspection subsystem (e.g., by adding functionality described herein to an existing inspection system) such as the 29xx/28xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system. Furthermore, although the inspection subsystem is described herein as a light-based inspection subsystem, it is to be understood that the inspection subsystem may be configured as an electron beam subsystem.

Further modifications and alternative embodiments of various aspects of the invention will be apparent to those skilled in the art in view of this description. For example, methods and systems for detecting defects on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for detecting defects on a wafer, comprising:

acquiring output for a wafer generated by an inspection system, wherein different dies are printed on the wafer with different process conditions, and wherein the different process conditions correspond to different failure modes for the wafer;

comparing the output generated for a first of the different dies printed with the different process conditions corresponding to a first of the different failure modes with the output generated for a second of the different dies printed with the different process conditions corresponding to a second of the different failure modes opposite to the first of the different failure modes, wherein the different process conditions corresponding to the different failure modes comprise process conditions at corners of a process window for the wafer, wherein the different process conditions corresponding to the first of the different failure modes are at a first of the corners of the process window, and wherein the different process conditions corresponding to the second of the different failure modes are at a second of the corners of the process window opposite to the first of the corners;

detecting defects on the wafer based on results of said comparing the output, wherein said acquiring, said comparing the output, and said detecting are performed by a computer system; and determining he process window by:

simulating printing of the wafer to determine an expected process window;

acquiring additional output for another wafer generated the inspection system or another inspection system, wherein different dies are printed on the other wafer with additional process conditions, and wherein the additional process conditions comprise process conditions adjacent to expected corners of the expected process window and farther from nominal process conditions than the expected corners;

comparing the additional output generated for a first of the different dies printed on the other wafer with the additional process conditions adjacent to a first of the expected corners with the additional output generated for a second of the different dies printed on the other wafer with the additional process conditions adjacent to a second of the expected corners opposite from the first of the expected corners;

detecting defects on the other wafer based on results of comparing the additional output; and determining the process window based on the defects detected on the other wafer.

2. The method of claim 1, wherein the defects that are detected on the wafer comprise systematic defects.

3. The method of claim 1, wherein at least some locations of the defects that are detected on the wafer comprise previously undetected pattern failures in a design for the wafer.

4. The method of claim 1, wherein the comparing the output step comprises comparing the output generated for a third of the different dies printed on the wafer with the different process conditions corresponding to a third of the different failure modes with the output generated for a fourth of the different dies printed on the wafer with the different process conditions corresponding to a fourth of the different failure modes opposite to the third of the different failure modes.

5. The method of claim 1, further comprising binning the defects detected on the wafer into different groups, wherein the binning is performed separately for the different dies that are printed on the wafer with the different process conditions.

6. The method of claim 5, wherein the different groups correspond to different patterns in a design for the wafer.

7. The method of claim 1, further comprising selecting one or more of the defects detected on the wafer for defect review, wherein said selecting is performed separately for the different dies that are printed on the wafer at the different process conditions.

8. The method of claim 1, wherein all dies on the wafer are printed with the process conditions corresponding to one of the different failure modes.

9. The method of claim 1, wherein two or more of the different dies are printed on the wafer with the different process conditions that are the same.

10. The method of claim 1, wherein the first and the second of the different dies are printed adjacent to each other on the wafer in a row of dies extending across substantially an entire dimension of the wafer, and wherein the row of dies comprises dies printed with the different process conditions corresponding to the first of the different failure modes alternating with dies printed with the different process conditions corresponding to the second of the different failure modes.

11. The method of claim 1, wherein no dies on the wafer are printed with nominal process conditions for the process window for the different process conditions.

12. The method of claim 1, wherein no more than one of all dies on the wafer is printed with nominal process conditions for the process window for the different process conditions.

13. The method of claim 1, wherein the method does not comprise comparing the output generated for any of the different dies printed on the wafer with output for a die printed on the wafer with nominal process conditions for the process window for the different process conditions.

14. The method of claim 1, wherein the corners of the process window are defined by maximum and minimum values for the different process conditions, wherein the different process conditions further comprise process conditions at inner corners of the process window, and wherein the inner corners are adjacent to the corners and closer to nominal process conditions than the corners.

15. The method of claim 14, wherein the comparing the output step comprises comparing the output generated for a third of the different dies printed on the wafer with the different process conditions at a first of the inner corners of the process window with the output generated for a fourth of the different dies printed on the wafer with the different process conditions at a second of the inner corners opposite to the first of the inner corners.

16. The method of claim 1, wherein the method further comprises determining if the process window is correct based on the defects detected on the wafer.

17. A non-transitory computer-readable medium, storing program instructions executable on a computer system for performing a computer-implemented method for detecting defects on a wafer, wherein the computer-implemented method comprises:

acquiring output for a wafer generated by an inspection system, wherein different dies are printed on the wafer with different process conditions, and wherein the different process conditions correspond to different failure modes for the wafer;

comparing the output generated for a first of the different dies printed with the different process conditions corresponding to a first of the different failure modes with the output generated for a second of the different dies printed with the different process conditions corresponding to a second of the different failure modes opposite to the first of the different failure modes, wherein the different process conditions corresponding to the different failure modes comprise process conditions at corners of a process window for the wafer, wherein the different process conditions corresponding to the first of the different failure modes are at a first of the corners of the process window, and wherein the different process conditions corresponding to the second of the different failure modes are at a second of the corners of the process window opposite of the first of the corners;

detecting defects on the wafer based on results of said comparing the output; and determining the process window by;

simulating printing of the wafer to determine an expected process window;

acquiring additional output for another wafer generated by the inspection system or another inspection system, wherein different dies are printed on the other wafer with additional process conditions, and wherein the additional process conditions comprise process conditions adjacent to expected corners of the expected process window and farther from nominal process conditions than the expected corners;

comparing the additional output generated for a first of the different dies printed on the other wafer with the additional process conditions adjacent to a first of the expected corners with the additional output generated for a second of the different dies printed on the other wafer with the additional process conditions adjacent to a second of the expected corners opposite from the first of the expected corners;

detecting defects on the other wafer based on results of comparing the additional output; and determining the process window based on the defects detected on the other wafer.

18. A system configured to detect defects on a wafer, comprising:

an inspection subsystem configured to generate output for a wafer, wherein different dies are printed on the wafer with different process conditions, and wherein the different process conditions correspond to different failure modes for the wafer; and a computer subsystem configured for:

comparing the output generated for a first of the different dies printed with the different process conditions corresponding to a first of the different failure modes with the output generated for a second of the different dies printed with the different process conditions corresponding to a. second of the different failure modes opposite to the first of the different failure modes, wherein the different process conditions corresponding to the different failure modes comprise process conditions at corners of a process window for the wafer, wherein the different process conditions corresponding to the first of the different failure modes are at a first of the corners of the process window, and wherein the different process conditions corresponding to the second of the different failure modes are at a second of the corners of the process window opposite to the first of the corners;

detecting defects on the wafer based on results of said comparing; and determining the process window by;

simulating printing of the wafer to determine an expected process window;

acquiring additional output for another wafer generated by the inspection system or another inspection system, wherein different dies are printed on the other wafer with additional process conditions and wherein the additional process conditions comprise process conditions adjacent to expected corners of the expected process window and farther from nominal process conditions than the expected corners;

comparing the additional output generated for a first of the different dies printed on the other wafer with the additional process conditions adjacent to a first of the expected corners with the additional output generated for a second of the different dies printed on the other wafer with the additional process conditions adjacent to a second of the expected corners opposite from the first of the expected corners;

detecting defects on the other wafer based on results of comparing the additional output; and determining the process window based on the defects detected on the other wafer.

19. The system of claim 18, wherein the defects that are detected on the wafer comprise systematic defects.

20. The system of claim 18, wherein at least some locations of the defects that are detected on the wafer comprise previously undetected pattern failures in a design for the wafer.

21. The system of claim 18, wherein said comparing the output comprises comparing the output generated for a third of the different dies printed on the wafer with the different process conditions corresponding to a third of the different failure modes with the output generated for a fourth of the different dies printed on the wafer with the different process conditions corresponding to a fourth of the different failure modes opposite to the third of the different failure modes.

22. The system of claim 18, wherein the computer subsystem is further configured for binning the defects detected on the wafer into different groups, and wherein the binning is performed separately for the different dies that are printed on the wafer with the different process conditions.

23. The system of claim 22, wherein the different groups correspond to different patterns in a design for the wafer.

24. The system of claim 18, wherein the computer subsystem is further configured for selecting one or more of the defects detected on the wafer for defect review, and wherein said selecting is performed separately for the different dies that are printed on the wafer at the different process conditions.

25. The system of claim 18, wherein all dies on the wafer are printed with the process conditions corresponding to one of the different failure modes.

26. The system of claim 18, wherein two or more of the different dies are printed on the wafer with the different process conditions that are the same.

27. The system of claim 18, wherein the first and the second of the different dies are printed adjacent to each other on the wafer in a row of dies extending across substantially an entire dimension of the wafer, and wherein the row of dies comprises dies printed with the different process conditions corresponding to the first of the different failure modes alternating with dies printed with the different process conditions corresponding to the second of the different failure modes.

28. The system of claim 18, wherein no dies on the wafer are printed with nominal process conditions for the process window for the different process conditions.

29. The system of claim 18, wherein no more than one of all dies on the wafer is printed with nominal process conditions for the process window for the different process conditions.

30. The system of claim 18, wherein the computer subsystem is not configured for comparing the output generated for any of the different dies printed on the wafer with output for a die printed on the water with nominal process conditions for the process window for the different process conditions.

31. The system of claim 18, wherein the corners of the process window are defined by maximum and minimum values for the different process conditions, wherein the different process conditions further comprise process conditions at inner corners of the process window, and wherein the inner corners are adjacent to the corners and closer to nominal process conditions than the corners.

32. The system of claim 31, wherein said comparing comprises comparing the output generated for a third of the different dies printed on the wafer with the different process conditions at a first of the inner corners of the process window with the output generated for a fourth of the different dies printed on the wafer with the different process conditions at a second of the inner corners opposite to the first of the inner corners.

33. The system of claim 18, wherein the computer subsystem is further configured for determining if the process window is correct based on the defects detected on the wafer.

* * * * *